US008552503B2

(12) United States Patent
Hwang et al.

(10) Patent No.: US 8,552,503 B2
(45) Date of Patent: Oct. 8, 2013

(54) STRAINED SILICON STRUCTURE

(75) Inventors: Guang-Yaw Hwang, Tainan County (TW); Ling-Chun Chou, Yunlin County (TW); I-Chang Wang, Tainan (TW); Shin-Chuan Huang, Tainan County (TW); Jiunn-Hsiung Liao, Tainan County (TW); Shin-Chi Chen, Tainan County (TW); Pau-Chung Lin, Taoyuan County (TW); Chiu-Hsien Yeh, Tainan (TW); Chin-Cheng Chien, Tainan County (TW); Chieh-Te Chen, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 191 days.

(21) Appl. No.: 12/957,304

(22) Filed: Nov. 30, 2010

(65) Prior Publication Data

US 2012/0132996 A1    May 31, 2012

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC ........................................ 257/368

(58) Field of Classification Search
USPC ............ 257/368, 384, 274, 351, 27, 47, 187, 257/337, 192, 197, 202, 423, 517, 414, 669, 257/365, 347, 369, 377, 382, 577, 557
See application file for complete search history.

(56) References Cited

U.S. PATENT DOCUMENTS

| | | | |
|---|---|---|---|
| 6,946,350 B2 | 9/2005 | Lindert | |
| 7,060,579 B2 | 6/2006 | Chidambaram | |
| 7,303,999 B1 | 12/2007 | Sriraman | |
| 8,003,460 B2 * | 8/2011 | Wirbeleit et al. | 438/231 |
| 2006/0115949 A1 | 6/2006 | Zhang | |
| 2006/0278920 A1 * | 12/2006 | Kim | 257/327 |
| 2010/0025771 A1 * | 2/2010 | Hoentschel et al. | 257/369 |
| 2012/0021583 A1 | 1/2012 | Wu | |
| 2012/0074468 A1 | 3/2012 | Yeh | |

* cited by examiner

*Primary Examiner* — Chuong A. Luu
(74) *Attorney, Agent, or Firm* — Winston Hsu; Scott Margo

(57) ABSTRACT

A strained silicon substrate structure includes a first transistor and a second transistor disposed on a substrate. The first transistor includes a first gate structure and two first source/drain regions disposed at two sides of the first gate structure. A first source/drain to gate distance is between each first source/drain region and the first gate structure. The second transistor includes a second gate structure and two source/drain doped regions disposed at two side of the second gate structure. A second source/drain to gate distance is between each second source/drain region and the second gate structure. The first source/drain to gate distance is smaller than the second source/drain to gate distance.

12 Claims, 7 Drawing Sheets

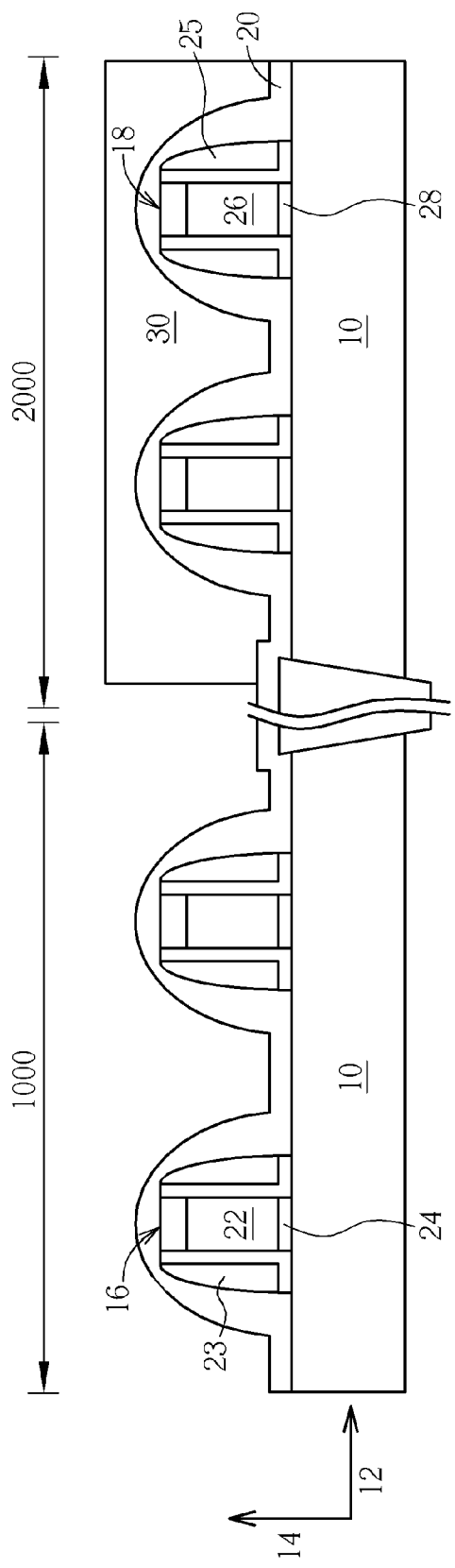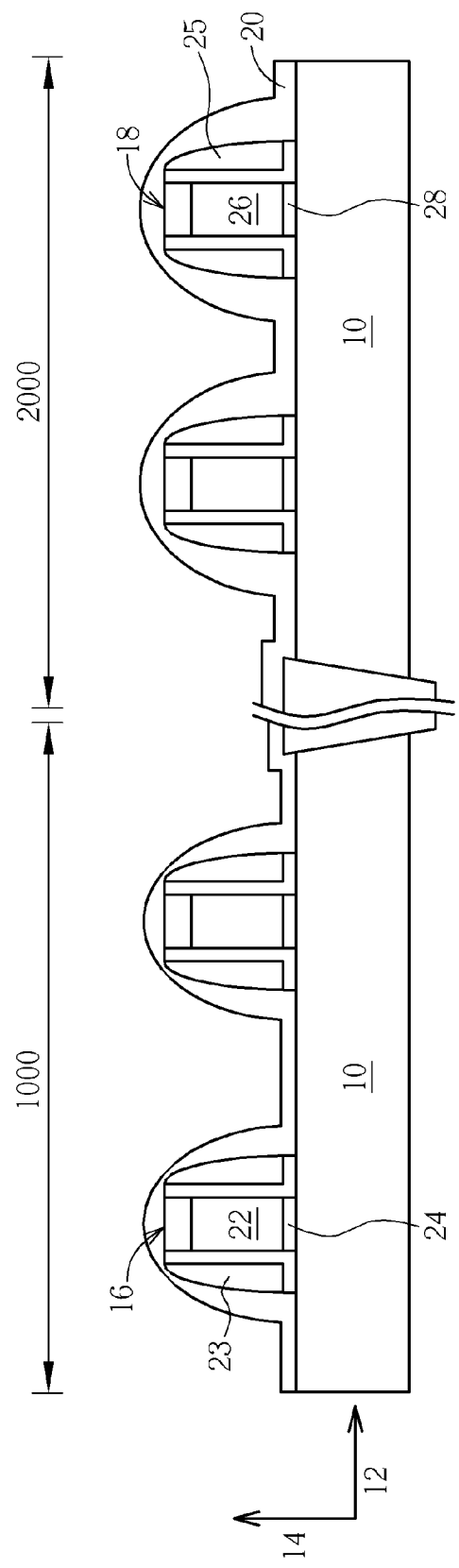

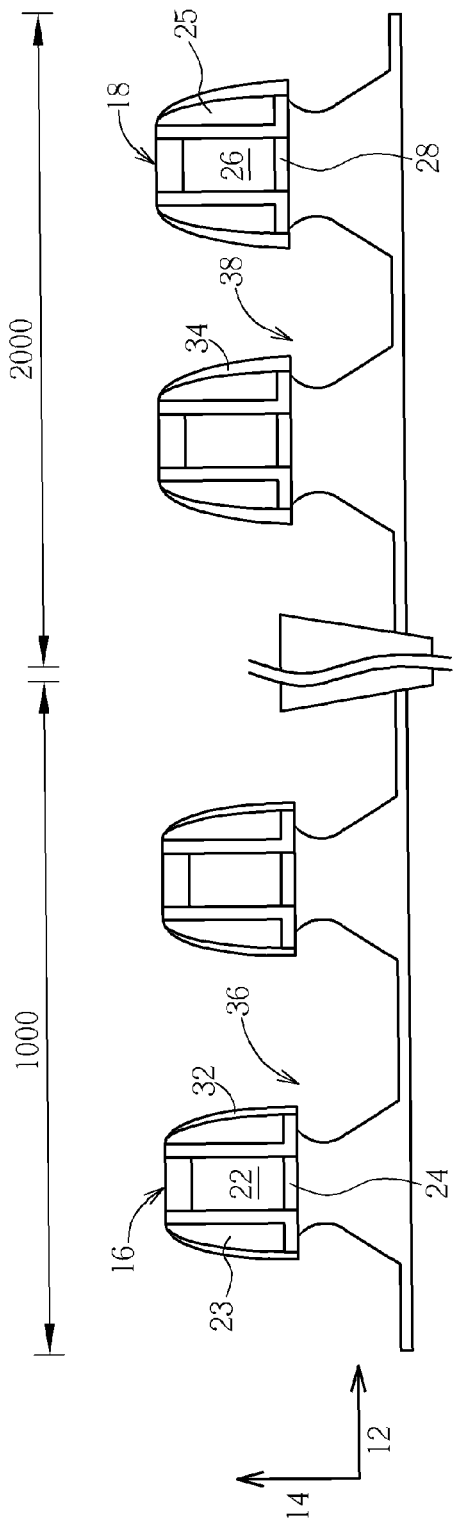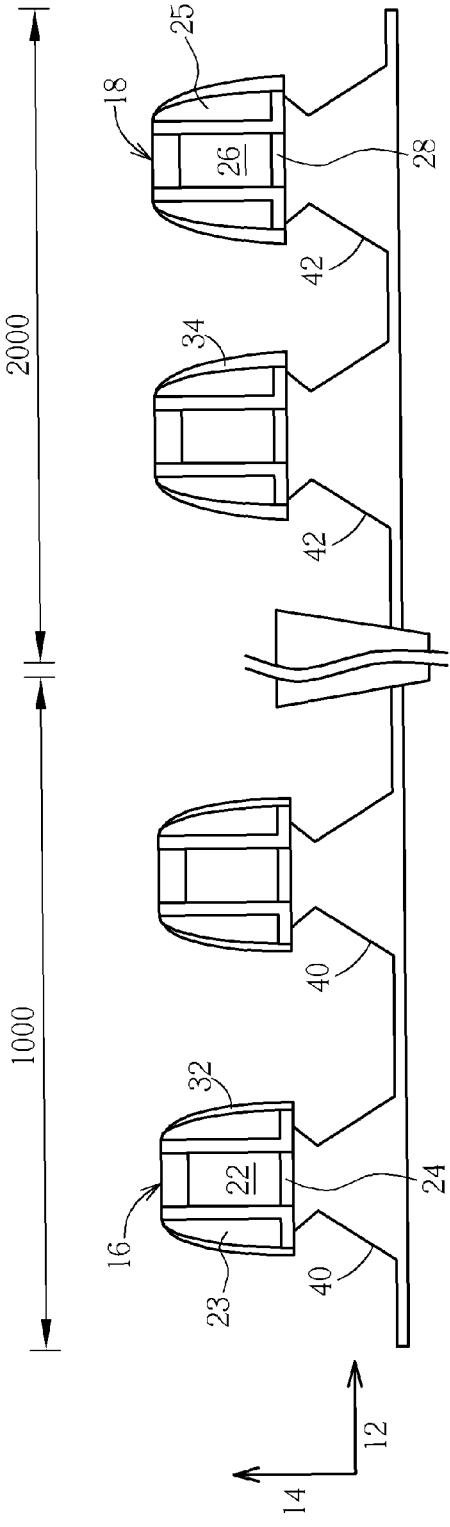

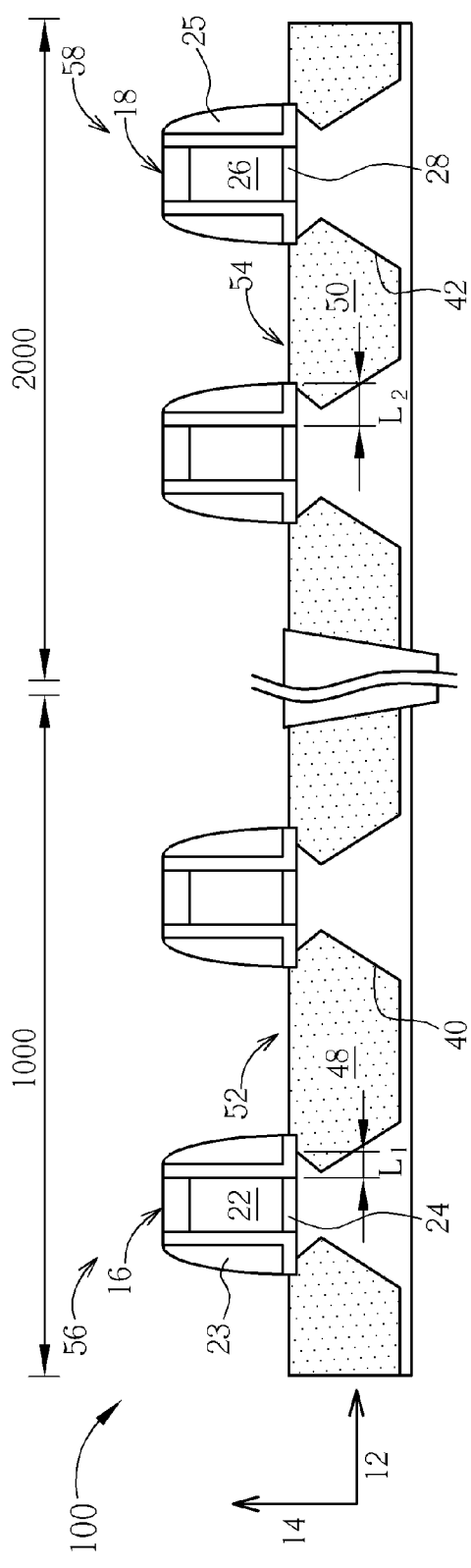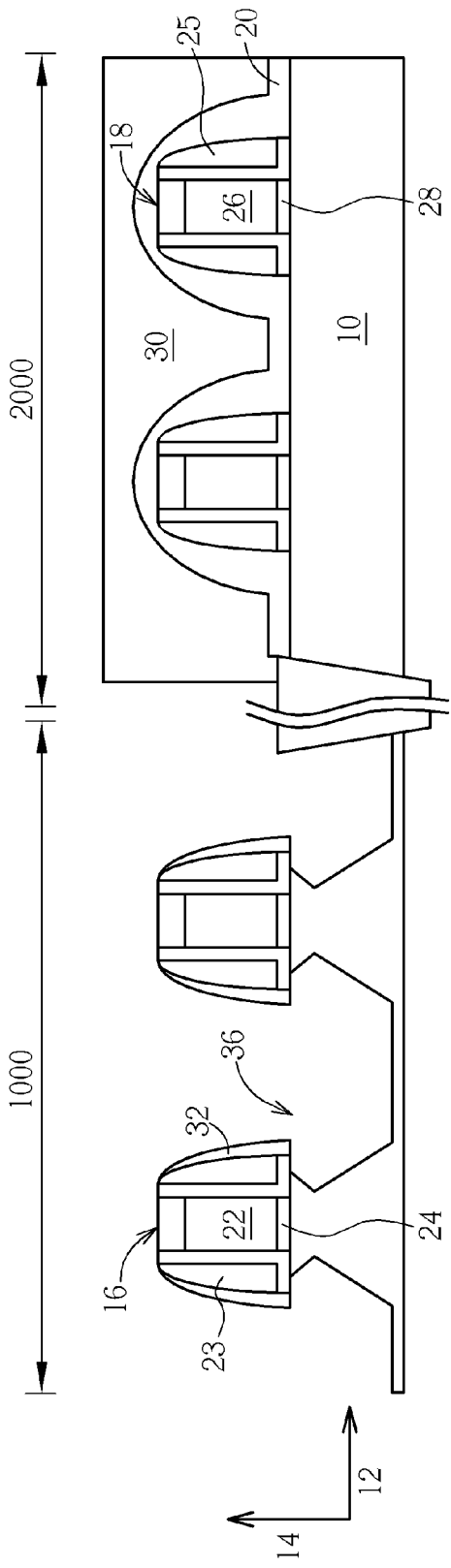

STRAINED SILICON STRUCTURE

BACKGROUND OF THE INVENTION

1. Field of the Invention

The present invention relates to a strained silicon structure, and more particularly to a strained silicon structure having different channel strain in the high density region and in the low density region.

2. Description of the Prior Art

The performance of Si semiconductor elements, MOSFETs in particular, has increased year after year with the advance of large-scale integrated circuits (LSI). Recently, however, it has appeared that the miniaturization attained by lithographic technology has reached its limit, and that carrier mobility has almost reached theoretical mobility in Si. To attain higher performance of the semiconductor device, attempts have been made to use a strained silicon (Si) layer grown epitaxially on a Si wafer with a silicon germanium (SiGe) layer in a recess in the substrate.

Generally, the wafer can be separated into a high density region and a low density region. The high density region has higher density of devices, and the low density region has lower density of devices. The recesses for the SiGe layer in the high density region and the low density region are formed by using the same etching step. Because the device density is different in the high density region and the low density region, the recesses in the high density region and the low density region may have different shapes. After the SiGe layer is grown in the recesses with different shapes, the stress provided by the SiGe layer will be different between the high density region and the low density region. As a result, the strained Si channels in the high density region and the low density region may become different and deteriorate the performance of the entire device.

SUMMARY OF THE INVENTION

Therefore, it is one objective of the present invention to provide a strained silicon structure which can control the channel strain within the high density region and the low density region.

According to a preferred embodiment of the present invention, a strained silicon structure comprises: a substrate having a top surface; and a first transistor disposed on the top surface, the first transistor comprising: a first gate structure disposed on the top surface, two first source/drain regions disposed in the substrate at two sides of the first gate structure, wherein a first source/drain to gate distance is defined between each of the first source/drain regions and the first gate structure, and each of the first source/drain regions is stressed, and a first channel disposed under the first gate structure. The strained silicon structure further comprises a second transistor disposed on the top surface, the second transistor comprising: a second gate structure disposed on the top surface, two second source/drain regions disposed in the substrate at two sides of the second gate structure, wherein a second source/drain to gate distance is defined between each of the second source/drain regions and the second gate structure, each of the second source/drain region is stressed, and the first source/drain to gate distance is smaller than the second source/drain to gate distance, and a second channel disposed under the second structure. A strain in the first channel is greater than a strain in the second channel.

According to another preferred embodiment of the present invention, a strained silicon structure comprises: a substrate having a top surface; a first transistor disposed on the top surface; and a second transistor disposed on the top surface, wherein a cross-sectional profile of a first source/drain region of the first transistor is different from a cross-sectional profile of a second source/drain region of the second transistor.

Because the first source/drain to gate distance is smaller than the second source/drain to gate distance, the channel strain in the high density region will be higher than the channel strain in the low density region. Therefore, the entire performance of the strained silicon structure will be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic cross-sectional diagrams illustrating a method of manufacturing a strained silicon structure in accordance with a first embodiment of the present invention.

FIG. 6 to FIG. 9 are schematic cross-sectional diagrams illustrating a method of manufacturing a strained silicon structure in accordance with a second embodiment of the present invention.

DETAILED DESCRIPTION

Figure 7:
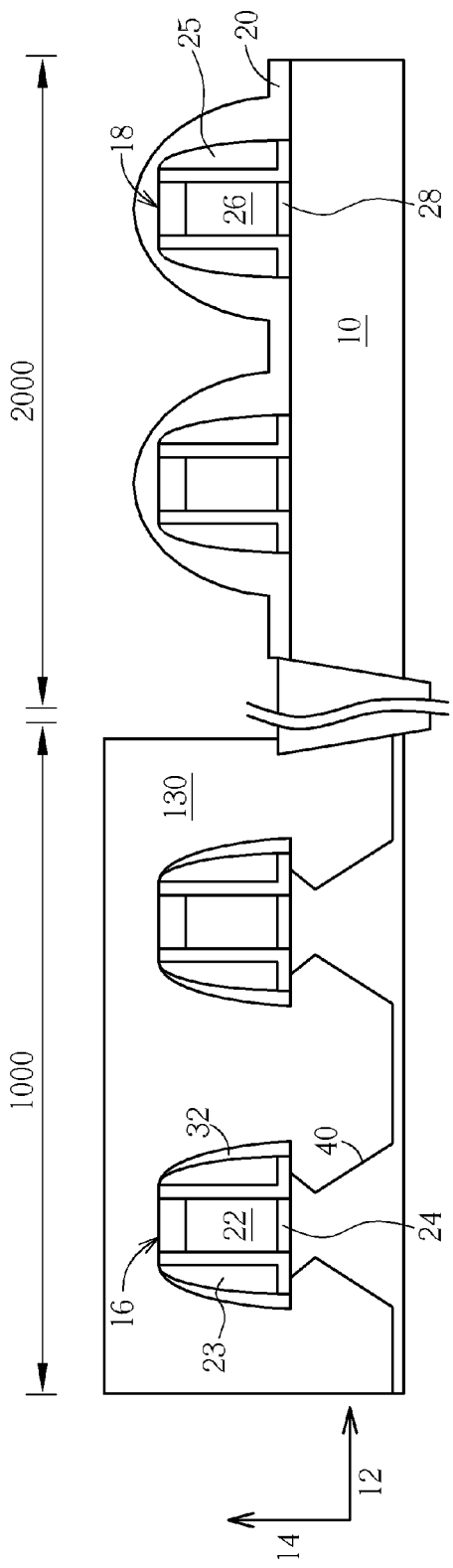

FIG. 1 to FIG. 5 are schematic cross-sectional diagrams illustrating a method of manufacturing a strained silicon structure in accordance with a first embodiment of the present invention.

As shown in FIG. 1, a substrate 10 having a top surface is provided. The substrate 10 is defined into a low density region 1000 and a high density region 2000. The substrate 10 may be silicon substrate. A horizontal direction 12 is parallel to the top substrate of the substrate 10. A vertical direction 14 is perpendicular to the top surface of the substrate 10. Numerous first gate structures 16 are disposed within the low density region 1000, and numerous second gate structures 18 are disposed within the high density region 2000. The shortest distance between each first gate structure 16 is shorter than the shortest distance between each second gate structure 18. The first gate structure 16 includes a first gate 22 and a first gate dielectric layer 24. The first gate dielectric layer 24 is disposed between the substrate 10 and the first gate 22. A spacer 23 is positioned around the first gate structure 16. The second gate structure 18 includes a second gate 26 and a second gate dielectric layer 28. The second gate dielectric layer 28 is disposed between the substrate 10 and the second gate 26. A spacer 25 is positioned around the second gate structure 18. A sacrificing spacer material layer 20 covers each first gate structure 16, each second gate structure 18 and spacers 23, 25.

Next, a mask layer 30 covers the sacrificing spacer material layer 20 within the high density region 2000, and exposes the sacrificing spacer material layer 20 within the low density region 1000. After that, the thickness of the sacrificing spacer material layer 20 within the low density region 1000 is reduced by a dry etch process. Later, as shown in FIG. 2, the mask layer 30 is removed.

As shown in FIG. 3, the sacrificing spacer material layer 20 is dry etched to form sacrificing spacers 32, 34 around the spacer 23, 25, respectively. It is noteworthy that the thickness of the sacrificing spacer material layer 20 within the low density region 1000 is reduced. This results in the thickness of the sacrificing spacer 32 on the first gate structure 16 being smaller than the thickness of the sacrificing spacer 34 on the second gate structure 18. Then, the substrate 10 is dry etched mainly in the horizontal direction 12 by an $SF_6$-base etchant or an $NF_3$-base etchant where the sacrificing spacers 32, 34 are taken as an etching mask. The $SF_6$-base etchant or $NF_3$-base etchant will etch the substrate 10 in both the horizontal direction 12 and vertical direction 14. The etching rate in the horizontal direction 12 is much faster than the etching rate in the vertical direction 14. Then, the substrate 10 can be etched in the vertical direction 14 optionally. At this point, a plurality of first dry etch recesses 36 are formed in the substrate 10 within the low density region 1000. A plurality of second dry etch recesses 38 are formed in the substrate 10 within the high density region 2000.

As shown in FIG. 4, a wet etch process is performed on the substrate 10 by using $NH_4OH$-base etchant or TMAH-base etchant. The concentration of the TMAH-base etchant is smaller than 2.5%. The etchant etches the first dry etch recess 36 and the second dry etch recess 38 along [110] and [111] plane of the substrate 10. Later, numerous first polygon recesses 40 and numerous second polygon recesses 42 are formed within the low density region 1000 and the high density region 2000, respectively.

As shown in FIG. 5, the sacrificing spacers 32, 34 are removed. Based on different embodiment, the sacrificing spacers 32, 34 can be kept to serve as spacers. In other words, the sacrificing spacers 32, 34 can be removed optionally. In the following description, the sacrificing spacers 32, 34 are removed.

Then, first and second epitaxial layers 48, 50 are formed in the first polygon recess 40 and second polygon recess 42 respectively. The top surfaces of the first epitaxial layer 48 and the second epitaxial layer 50 are preferred to be higher than the top surface of the substrate to improve the stress. Later, an implantation process is performed to form first source/drain regions 52 in the epitaxial layers 48 at two sides of the first gate structure 16 to complete a first transistor 56. Two second source/drain 54 region are formed in the epitaxial layers 50 at two sides of the second gate structure 18 to complete a second transistor 58. At this point, the strained silicon structure 100 according to the first embodiment of the present invention is completed. It is noteworthy that a first source/drain to gate distance $L_1$ is defined between the first source/drain region 52 and the first gate structure 16. A second source/drain to gate distance $L_2$ is defined between the second source/drain region 54 and the second gate structure 18. The first source/drain to gate distance $L_1$ is smaller than the second source/drain to gate distance $L_2$.

FIG. 6 to FIG. 9 are schematic cross-sectional diagrams illustrating a method of manufacturing a strained silicon structure in accordance with a second embodiment of the present invention, wherein like numerals designate similar or the same parts, regions or elements. The difference between the first preferred embodiment and the second preferred embodiment is that the recess of the first transistor is formed prior to the recess of the second transistor in the second preferred embodiment. The fabricating method of the recess of the first transistor in the second preferred embodiment is the same as that of the first preferred embodiment.

The method of forming the recess of the first transistor will be described briefly as below. As shown in FIG. 6, a substrate 10 defined into a low density region 1000 and a high density region 2000 is provided. A horizontal direction 12 is parallel to the top substrate of the substrate 10. A vertical direction 14 is perpendicular to the top surface of the substrate 10. Numerous first gate structures 16 are disposed within the low density region 1000, and numerous second gate structures 18 are disposed within the high density region 2000. A sacrificing spacer material layer 20 covers each first gate structure 16 and each second gate structure 18. Then, a mask layer 30 covers the high density region 2000 entirely and exposes the sacrificing spacer material layer 20 within the low density region 1000. Later, a sacrificing spacer material layer 20 within the low density region 1000 is etched to form a sacrificing spacer 32 on the spacer 23 around the first gate structure 16, and a dry etch recess (not shown) in the substrate 10. After that, a wet etch is performed to form first polygon recesses 40 in the substrate 10 at two sides of the first gate structure 16, respectively. The cross sectional profile of the first polygon recess 40 along the vertical direction 14 could be a diamond-like shape, an octagon, or a U shape. Preferably, the cross sectional profile of the first polygon recess 40 is a diamond-like shaped. Please refer to the steps in FIG. 3 to FIG. 4 of the detailed description of the formation of the first polygon recess 40.

Figure 8:
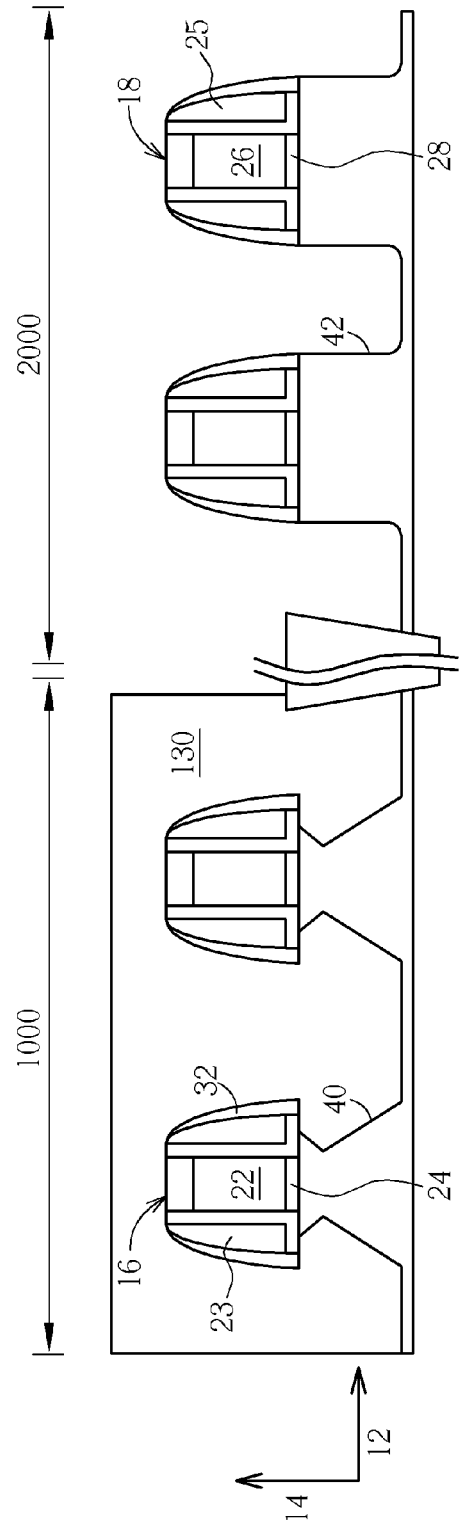

FIG. 7 to FIG. 8 describe the steps of forming the recess of the second transistor. As shown in FIG. 7, the mask layer 30 is removed. Then, a mask layer 130 is formed to cover the low density region 1000 and expose the sacrificing spacer material layer 20 within the high density region 2000. Later, the sacrificing spacer material layer 20 is dry etched to form a sacrificing spacer 34 on the spacer 25 around the second gate structure 18. Subsequently, the substrate 10 is dry etched along the vertical direction 14 by taking the sacrificing spacer 34 and the second gate structure 18 as a mask to form two second polygon recesses 42 in the substrate 10 at two sides of the second gate structure 18. The cross sectional profile of the second polygon recess 42 along the vertical direction 14 could be a diamond-like shape, an octagon, or a U shape. Preferably, the cross sectional profile of the second polygon recess 42 is U shaped.

Figure 9:
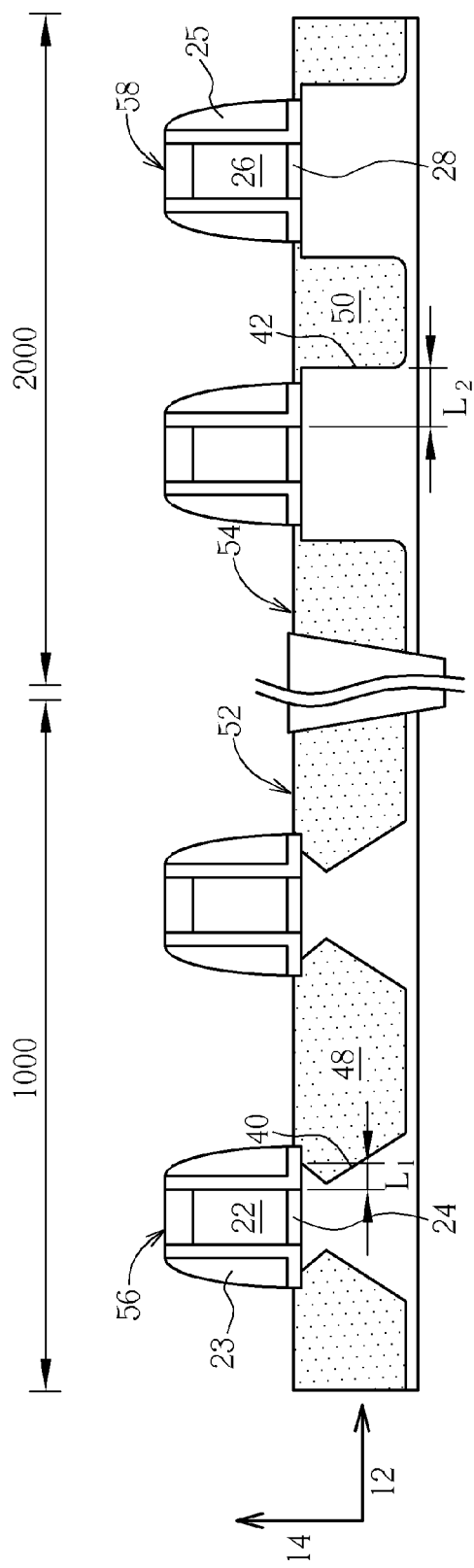

As shown in FIG. 9, the sacrificing spacers 32, 34 are removed. Based on different embodiments, the sacrificing spacers 32, 34 can be kept to serve as spacers. In other words, the sacrificing spacers 32, 34 can be removed optionally. In the following description, the sacrificing spacers 32, 34 are removed.

First and second epitaxial layers 48, 50 are formed in the first polygon recess 40 and second polygon recess 42 respectively. Later, an implantation process is performed to form first source/drain regions 52 in the epitaxial layers 48 at two sides of the first gate structure 16 to complete a first transistor 56. Two second source/drain regions 54 are formed in the epitaxial layers 50 at two sides of the second gate structure 18 to complete a second transistor 58. At this point, the strained silicon structure 100 according to the second embodiment of the present invention is completed. It is noteworthy that a first source/drain to gate distance $L_1$ is defined between the first source/drain region 52 and the first gate structure 16. A second source/drain to gate distance $L_2$ is defined between the second source/drain region 54 and the second gate structure 18. The first source/drain to gate distance $L_1$ is smaller than the second source/drain to gate distance $L_2$.

Figure 10:
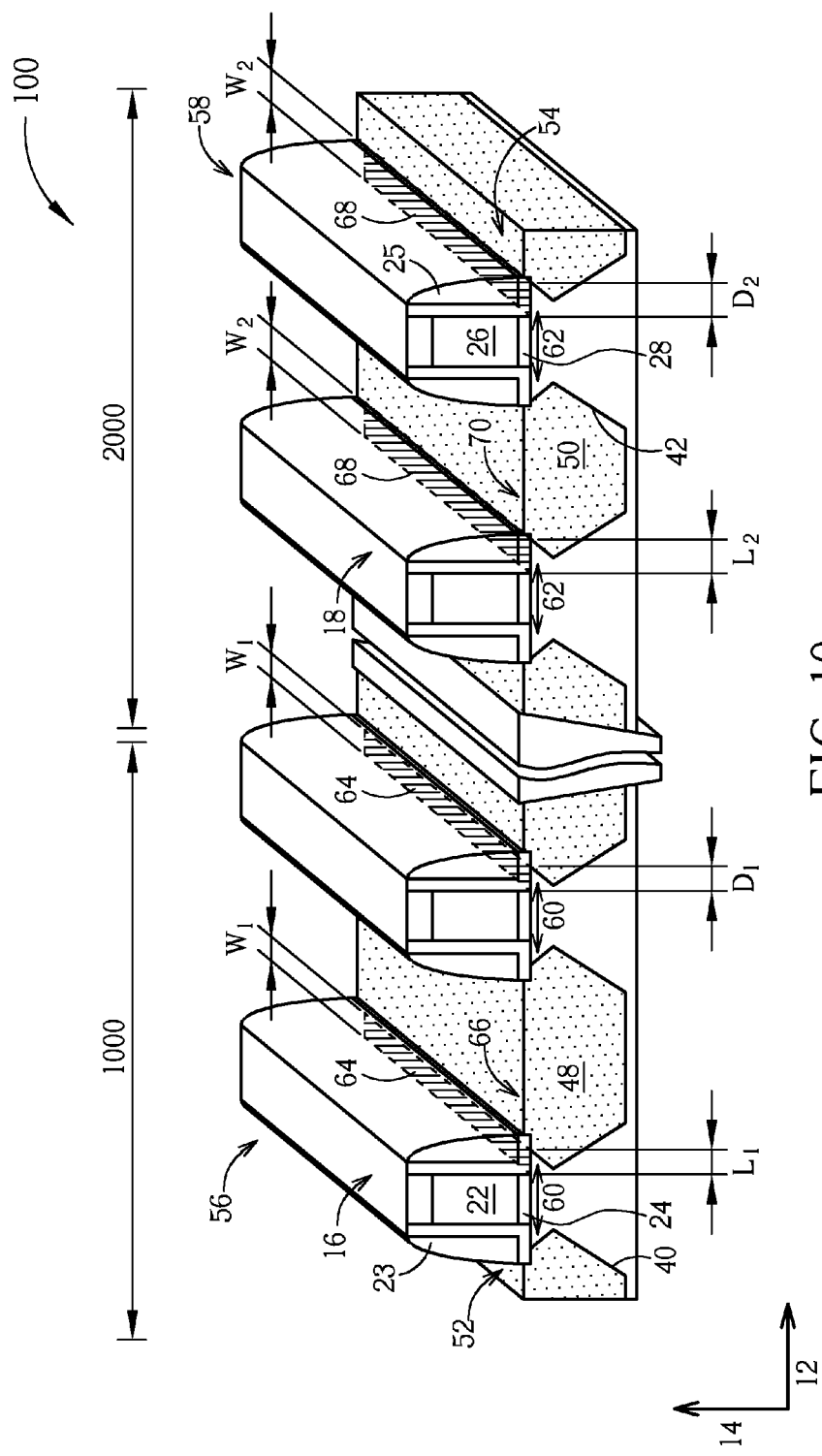
FIG. 10 is a three dimensional diagram of the strained silicon structure fabricated by the first preferred embodiment.

FIG. 10 is a three dimensional diagram of the strained silicon structure fabricated by the first preferred embodiment, wherein like numerals designate similar or the same parts, regions or elements. As shown in FIG. 10, the strained silicon structure 100 includes a substrate 10 having a top surface. The substrate 10 is defined into a low density region 1000 and a high density region 2000. The substrate 10 may be silicon substrate. A horizontal direction 12 is parallel to the top substrate of the substrate 10. A vertical direction 14 is perpendicular to the top surface of the substrate 10. Numerous first transistors 56 are disposed within the low density region 1000, and numerous second transistors 58 are disposed within the high density region 2000. The first transistor 56 includes a first gate structure 16 disposed on the top surface of the substrate 10. The first gate structure 16 includes a first gate 22 and a first gate dielectric layer 24. The first gate dielectric layer 24 is disposed between the substrate 10 and the first gate 22. Two first source/drain regions 52 are disposed in the substrate 10 at two sides of the substrate 10, respectively. A first source/drain to gate distance $L_1$ is defined between the first source/drain region 52 and the first gate structure 16. Each first source/drain region 52 is stressed. A first channel 60 is disposed in the substrate 10 under the first gate structure 16. It is noteworthy that a spacer 23 is disposed around the first gate structure 16. The spacer 23 could be a composite spacer. An interface 64 is between the top surface of the substrate 10 and the spacer 23. The interface 64 has a first width $W_1$. The first width $W_1$ is equal to the first source/drain to gate distance $L_1$. In addition, each of the first source/drain regions 52 includes a first polygon recess 40 in the substrate 10 at one side of the first gate structure 16. The first polygon recess 40 has a first opening 66. A first distance $D_1$ is the shortest distance between the first opening 66 to the first gate structure 16. That is, the first width $W_1$ is equal to the first distance $D_1$.

In addition, a first epitaxial layer 48 fills the first polygon recess 40. The first epitaxial layer 48 is preferably SiGe. Therefore the first epitaxial layer 48 provides stress to the first channel 60, and makes the first channel 60 strained.

The second transistor 58 includes a second gate structure 18 disposed on the top surface of the substrate 10. The second gate structure 18 includes a second gate 26 and a second gate dielectric layer 28. The second gate dielectric layer 28 is disposed between the substrate 10 and the second gate 26. Two second source/drain regions 54 are disposed in the substrate 10 at two sides of the substrate 10, respectively. A second source/drain to gate distance $L_2$ is defined between the second source/drain region 54 and the second gate structure 18. Each second source/drain region 54 is stressed. A second channel 62 is disposed in the substrate 10 under the second gate structure 18. It is noteworthy that a spacer 25 is disposed around the second gate structure 18. The spacer 25 could be a composite spacer. An interface 68 is between the top surface of the substrate 10 and the spacer 25. The interface 68 has a second width $W_2$. The second width $W_2$ is equal to the second source/drain to gate distance $L_2$. In addition, each of the second source/drain regions 54 includes a second polygon recess 42 in the substrate 10 at one side of the second gate structure 18. The second polygon recess 42 has a second opening 70. A second distance $D_2$ is the shortest distance between the second opening 70 to the second gate structure 18. That is, the second width $W_2$ is equal to the second distance $D_2$.

In addition, a second epitaxial layer 50 such as SiGe fills the second polygon recess 42. Therefore the second epitaxial layer 50 provides stress to the second channel 62, and makes the second channel 62 strained.

It is noteworthy that the first source/drain to gate distance $L_1$ is smaller than the second source/drain to gate distance $L_2$. In other words, the first distance $D_1$ is shorter than the second distance $D_2$, and the first width $W_1$ is smaller than the second width $W_2$. In this way, the distance between the first epitaxial layer 48 and the first channel 60 is shorter than the distance between the second epitaxial layer 50 and the second channel 62. As a result, the strain in the first channel 60 is larger than the strain in the second channel 62.

Moreover, the cross-sectional profile of the first source/drain region 52 along the vertical direction 14 could be a diamond-like shape, an octagon, or a U shape. However, the profile of the first source/drain region 52 is preferably a diamond-like shape in this embodiment. The cross sectional profile of the second source/drain region 54 along the vertical direction 14 could be a diamond-like shape, an octagon, or a U shape. Preferably, the cross sectional profile of the second source/drain region 54 is diamond-like shaped as well.

Furthermore, the first transistor 56 can be a logic device, a memory device or an input/output device. In the present embodiment, the first transistor 56 is preferably a logic device such as PMOS. The second transistor 58 can be a logic device, a memory device or an input/output device. In the present embodiment, the second transistor 58 is preferably a memory device such as an SRAM.

Figure 11:
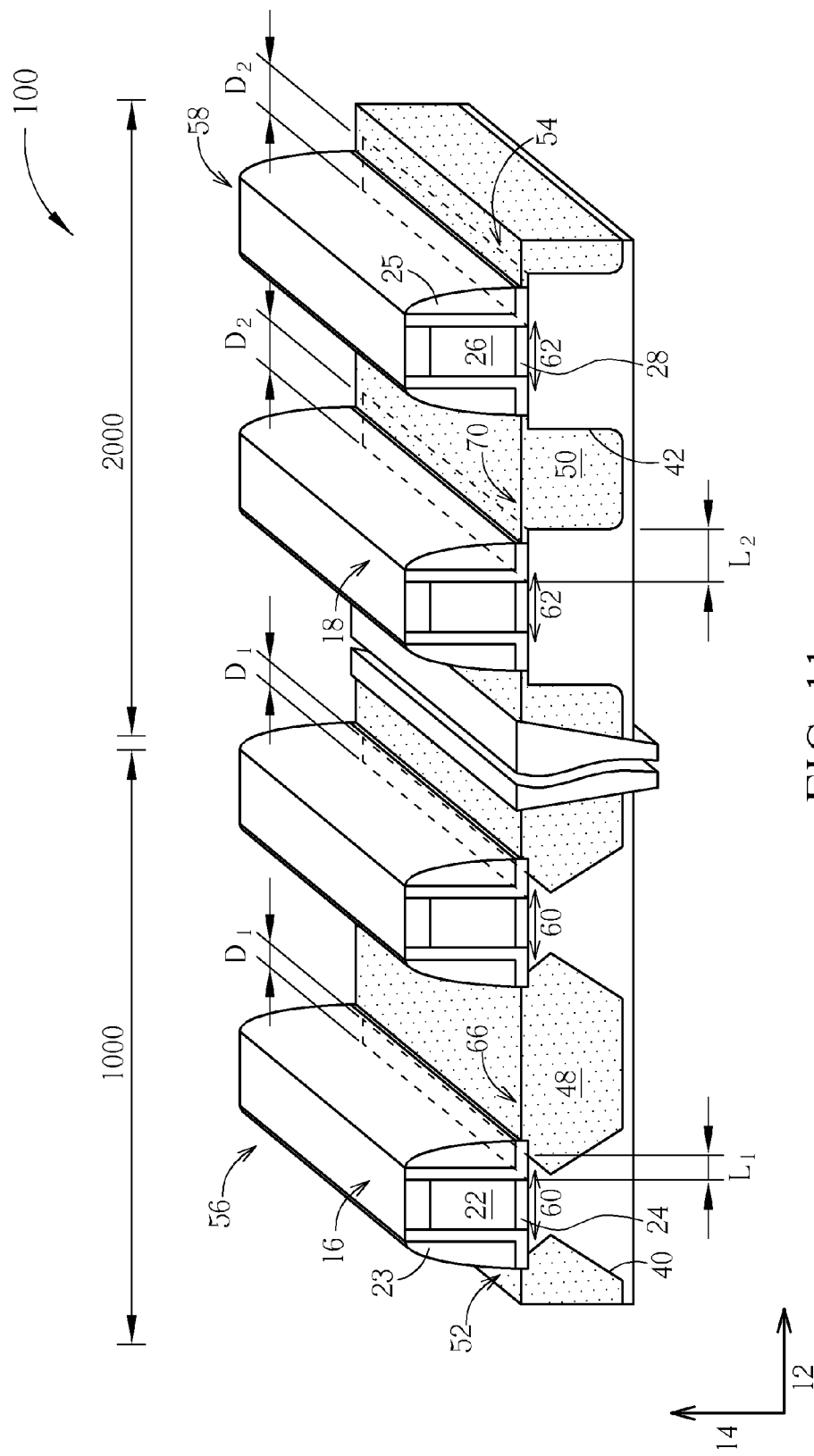
FIG. 11 is a three dimensional diagram of the strained silicon structure fabricated by the second preferred embodiment.

FIG. 11 is a three dimensional diagram of the strained silicon structure fabricated by the second preferred embodiment, wherein like numerals designate similar or the same parts, regions or elements. The second embodiment feature is that the shape of the recesses of the first transistor is different from the shape of the recesses of the second transistor. Other elements in the second preferred embodiment have the same location and function as the elements in the first preferred embodiment.

As shown in FIG. 11, the strained silicon structure 100 includes a substrate 10 having a top surface. A horizontal direction 12 is parallel to the top substrate of the substrate 10. A vertical direction 14 is perpendicular to the top surface of the substrate 10. Numerous first transistors 56 are disposed within the low density region 1000, and numerous second transistors 58 are disposed within the high density region 2000. The first transistor 56 includes a first gate structure 16, two first source/drain regions 52, and a first channel 60. A first source/drain to gate distance $L_1$ is defined between the first source/drain region 52 and the first gate structure 16.

A spacer 23 is disposed around the first gate structure 16. The spacer 23 could be a composite spacer. In addition, each of the first source/drain regions 52 includes a first polygon recess 40 in the substrate 10 at one side of the first gate structure 16. The first polygon recess 40 has a first opening 66. A first distance $D_1$ is the shortest distance between the first opening 66 to the first gate structure 16. That is, the first source/drain to gate distance $L_1$ equals the first distance $D_1$. In addition, a first epitaxial layer 48 fills the first polygon recess 40, and makes the first channel 60 strained.

The second transistor 58 includes a second gate structure 18, two second source/drain regions 54, and a second channel 62. A second source/drain to gate distance $L_2$ is defined between the second source/drain region 54 and the second gate structure 18.

A spacer 25 is disposed around the second gate structure 18. In addition, each of the second source/drain regions 54 includes a second polygon recess 42 in the substrate 10 at one side of the second gate structure 18. The second polygon recess 42 has a second opening 70. A second distance $D_2$ is the shortest distance between the second opening 70 to the second gate structure 18. That is, second source/drain to gate distance $L_2$ equals the second distance $D_2$. In addition, a second epitaxial layer 50 fills the second polygon recess 42, and makes the second channel 62 strained.

It is noteworthy that the first source/drain to gate distance $L_1$ is smaller than the second source/drain to gate distance $L_2$. In other words, the first distance $D_1$ is shorter than the second distance D2. In this way, the strain in the first channel 60 is larger than the strain in the second channel 62.

Moreover, the cross-sectional profile of the first source/drain region 52 along the vertical direction 14 could be a diamond-like shape, an octagon, or a U shape. However, the profile of the first source/drain region 52 is preferably diamond-like shape in this embodiment. The cross sectional profile of the second source/drain region 54 along the vertical direction 14 could be a diamond-like shape, an octagon, or a U shape. Preferably, the cross sectional profile of the second source/drain region 54 is U shaped.

Furthermore, the first transistor 56 can be a logic device, a memory device or an input/output device. In the present embodiment, the first transistor 56 is preferably a logic device such as a PMOS. The second transistor 58 can be a logic device, a memory device or an input/output device. In the present embodiment, the second transistor 58 is preferably a memory device such as an SRAM.

The SRAM is influenced more by its current leakage than its drive current. When the first transistor 56 is a logic device, and the second transistor 58 is a SRAM, the method provided in the present invention can be applied to adjust the structures of the first transistor 56 and the second transistor 58 to make the logic device and the SRAM both meet their product requirements simultaneously. According to the preferred embodiment of the present invention, the first source/drain to gate distance $L_1$ is smaller than the second source/drain to gate distance $L_2$. This feature leads to the channel within the low density region having higher strain than the channel within the high density region has. Therefore, the transistors within the low density region and the high density region can attain adequate operational performance.

Those skilled in the art will readily observe that numerous modifications and alterations of the device and method may be made while retaining the teachings of the invention.

What is claimed is:

1. A strained silicon structure comprising:
    a substrate having a top surface and having a low density region and a high density region;
    a first transistor disposed on the top surface within the low density region, the first transistor comprising:
        a first gate structure disposed on the top surface; and
        a first source/drain region disposed in the substrate at one side of the first gate structure, wherein a first source/drain to gate distance is defined between the first source/drain region and the first gate structure, and the first source/drain region is stressed
        wherein the first source/drain region comprise:
        a first recess disposed in the substrate at one side of the substrate; and a first epitaxial layer filling the first recess; and
    a second transistor disposed on the top surface within the high density region, the second transistor comprising:
        a second gate structure disposed on the top surface; and
        a second source/drain region disposed in the substrate at one side of the second gate structure, wherein a second source/drain to gate distance is defined between the second source/drain region and the second gate structure, the second source/drain region is stressed, and the first source/drain to gate distance is smaller than the second source/drain to gate distance.

2. The strained silicon structure of claim 1, wherein the first recess has a first opening, and a first distance is the shortest distance between the first gate structure and the first opening.

3. The strained silicon structure of claim 2, wherein the second source/drain region comprises:
    a second recess disposed in the substrate at one side of the substrate; and
    a second epitaxial layer filling the second recess.

4. The strained silicon structure of claim 3, wherein the second recess has a second opening, and a second distance is the shortest distance between the second gate structure and the second opening.

5. The strained silicon structure of claim 4, wherein the first distance is shorter than the second distance.

6. The strained silicon structure of claim 1, wherein the cross-sectional profile of the first source/drain region comprises a diamond-like shape, an octagon, or a U shape.

7. The strained silicon structure of claim 1, wherein the cross-sectional profile of the second source/drain region comprises a diamond-like shape, an octagon, or a U shape.

8. The strained silicon structure of claim 1, wherein the first transistor comprises a logic device, a memory device or an input/output device.

9. The strained silicon structure of claim 1, wherein the second transistor comprises a logic device, a memory device or an input/output device.

10. The strained silicon structure of claim 1, further comprising:
    a first channel disposed under the first gate structure; and
    a second channel disposed under the second structure, wherein a strain in the first channel is greater than a strain in the second channel.

11. The strained silicon structure of claim 1, wherein the first transistor and the second transistor have a same conductivity type.

12. The strained silicon structure of claim 1, further comprising:
    a first epitaxial layer disposed within the first source/drain region; and
    a second epitaxial layer disposed within the second source/drain region,
    wherein the first epitaxial layer and the second epitaxial have a same composition.

* * * * *